United States Patent [19]

Ehrenberg et al.

[11] Patent Number: 5,199,163
[45] Date of Patent: Apr. 6, 1993

[54] METAL TRANSFER LAYERS FOR PARALLEL PROCESSING

[75] Inventors: Scott G. Ehrenberg, Fishkill; Janet L. Poetzinger, Pleasant Valley, both of N.Y.

[73] Assignee: International Business Machines Corporation, Armonk, N.Y.

[21] Appl. No.: 891,627

[22] Filed: Jun. 1, 1992

[51] Int. Cl.$^5$ .............................................. H05K 3/36
[52] U.S. Cl. ........................................ 29/830; 29/846;
156/630; 174/262; 361/412; 428/901
[58] Field of Search ................. 29/846, 830; 174/262;
156/630; 361/412; 428/901

[56] References Cited

U.S. PATENT DOCUMENTS

| | | |
|---|---|---|
| 2,692,190 | 10/1954 | Pritikin . |
| 3,181,986 | 5/1965 | Pritikin . |
| 3,606,677 | 9/1971 | Ryan .................. 29/846 X |
| 3,729,819 | 5/1973 | Horie .................. 29/846 X |
| 3,953,924 | 5/1976 | Zachry et al. . |
| 4,159,222 | 6/1979 | Lebow et al. . |
| 4,420,352 | 12/1983 | Schroeder et al. . |
| 4,604,160 | 8/1986 | Murakami et al. . |
| 4,606,787 | 8/1986 | Pelligrino . |
| 4,722,765 | 2/1988 | Ambros et al. .............. 29/846 X |
| 4,724,020 | 2/1988 | Ebata et al. . |
| 4,767,479 | 8/1988 | Ferguson et al. . |
| 4,790,902 | 12/1988 | Wada et al. . |
| 4,799,984 | 1/1989 | Rellick .................. 29/846 X |
| 4,830,691 | 5/1989 | Kida et al. .............. 29/846 X |
| 4,889,584 | 12/1989 | Wada et al. . |
| 4,897,918 | 2/1990 | Osaka et al. . |
| 4,928,870 | 5/1990 | Gat-Liquornik et al. . |
| 4,952,454 | 8/1990 | Iwamoto et al. . |
| 4,953,627 | 9/1990 | Ito et al. . |
| 4,961,259 | 10/1990 | Schreiber . |

OTHER PUBLICATIONS

IBM Technical Disclosure Bulletin, vol. 2, No. 1 Jun. 1959 p. 9 by Haddad et al.
IBM Technical Disclosure Bulletin vol. 8, No. 8 Jan. 1966 pp. 1025-1026 by Webb et al.
IBM Technical Disclosure Bulletin vol. 9 No. 11 Apr. 1967 pp. 1520-1521 by Kollmeier et al.

Primary Examiner—Carl J. Arbes
Attorney, Agent, or Firm—Ira David Blecker

[57] ABSTRACT

A structure and process for forming dense multi-layer thin film structures wherein individual layers of thin film wiring which can be pre-inspected and then laminated one on top of the next to form a three dimensional wiring matrix are disclosed.

10 Claims, 2 Drawing Sheets

METAL TRANSFER LAYERS FOR PARALLEL PROCESSING

BACKGROUND OF THE INVENTION

1. Field of the Invention

The present invention is generally related to a structure and process for forming dense multi-layer thin film structures and, more particularly, to a method of making individual layers of thin film wiring which can be pre-inspected and then laminated one on top of the next to form a three dimensional wiring matrix.

2. Description of the Prior Art

The fabrication of dense multi-layer thin film interconnect structures for high-density integrated circuits typically involves the sequential build-up of metal-patterned dielectric layers on silicon wafers or ceramic substrates. A first layer is formed on top of the substrate, then a second layer on top of the first and so forth in series. Among the various dielectric/insulator materials in thin film structures, sputtered (or PECVD) quartz, silicon nitride, and high-temperature stable polymers, especially polyimides, are most commonly used in conjunction with high-conductivity metallurgy such as aluminum/copper (Al/Cu), gold (Au), and/or copper.

The sequential build-up approach suffers from several limitations. First of all, every time a new layer is fabricated, the previously built layers are exposed to the entire process excursions, including thermal and chemical solvents, as well as mechanical and other stress-related operations. Secondly, since the electrical performance and long-term reliability of the resulting structure can only be determined after the conclusion of the entire fabrication process, the finished structure may have to be discarded if the performance does not meet the required specifications. This results in high cost of production and has other obvious limitations in terms of cycle time and throughput. In addition, when multilayer thin film is built directly on the substrate, it is not possible to build small sections of high density wiring, since the entire substrate must be coated and processed with the thin film.

When using polyimide dielectric or other high-temperature polymers, an alternate approach to fabricating thin film interconnect structures is based on the assembly of individual electrically inspectable metallized thin films (layers) which are laminated at high temperature such that metal-to-metal and polymer-to-polymer bonding can be achieved. This method eliminates some of the limitations of sequential processing, as each metallized dielectric layer is fabricated as a single unit which can be fully inspected for the desired electrical characteristics, then multiple layers are stacked and laminated under heat and pressure. However, although the method of transferring individually inspectable layers is potentially superior to the sequential build-up of layers, it has a fundamental problem with regard to the dimensional stability of the structure during both individual layer build and during the joining of the individual layers to form the composite structure. This is due to the fact that the thin polyimide films are generally fragile and are subject to deformation under thermal or solvent-related stress conditions. This can result in pattern misalignment and distortion during layer fabrication or in the process of lamination, and also when the composite structure undergoes accelerated reliability tests involving temperature and humidity excursions.

SUMMARY OF THE INVENTION

It is therefore an object of the present invention to provide a high density, multilayer thin film structure and process for its manufacture wherein multiple individually inspectable metal transfer layers are fabricated in parallel, preinspected for operational performance, and joined together to form a three dimensional wiring matrix.

It is yet another object of the invention to provide a high density, multilayer thin film structure and process for its manufacture wherein one or more of the individual layers may be attached to other electronic packaging components.

It is yet another object of the invention to provide a carrier metal for build-up of individual wiring patterns which is capable of withstanding thermal or other stress conditions related to the formation of a high density, multilayer thin film structure.

According to the invention, a wiring pattern is built on a metal carrier. The carrier has a thermal coefficient of expansion which matches that of a substrate onto which metal transfer layers will be laminated to prevent pattern misalignment and distortion during transfer. A thermoplastic dielectric coating is applied over the wiring pattern and vias are formed through the coating. A joining material is then deposited in the vias which enables the resulting metal transfer layer to be connected to a substrate. The layer is then subjected to inspection procedures and is subsequently laminated to the substrate if it passes inspection requirements. In a final step, the metal carrier is removed by etching. Additional layers may then be laminated on top of the resulting structure.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1A:
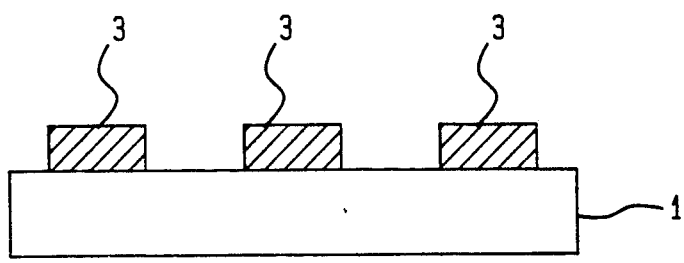
FIGS. 1a-e are sequential cross-sectional side views of a metallization transfer process.

Referring now to the drawings, and more particularly to FIGS. 1a-e, sequential cross-sectional side views of the elements of a metal transfer layer process are shown. An etchable sheet of metal forms a carrier 1 upon which high density wiring patterns 3 may be built. Preferably, the carrier 1 has a low thermal coefficient of expansion which matches that of the substrate 19 on which the metal transfer layer 11 will later be laminated. By matching the thermal coefficients of expansion, the carrier 1 will provide dimensional stability and stabilize pattern locations for alignment during the lamination process. The thickness and elastic modulus of the carrier 1 should also be designed to prevent deformation under thermal or solvent related stress conditions that occur during processing of the thin film layer. Generally, a thickness of 25 to 75 $\mu$m and an elastic modulus of $10^6$ psi will provide ease of handling and etching. Suitable materials for the carrier 1 include invar, nickel, stainless steel, molybdenum or copper. The carrier 1 thus provides control of the dimensions of the wiring pattern to promote the ability to form and align high density layers.

The carrier 1 also provides an electrically conductive seed layer for plating the high density wiring patterns 3 shown in FIG. 1a. The wiring patterns 3 are formed on the carrier 1 by standard processes such as standard evaporation or photoresist and additive plating sequences. The wiring patterns 3 are designed so that they will not etch when the carrier 1 is etched away. This is accomplished by selecting a patterned metallurgy or layers of metallurgy that do not etch in the solution used to etch the carrier 1. For example, a noble metal pattern or noble metal layer on the etchable carrier prior to plating the patterns on the carrier could be utilized. In a preferred embodiment, Au metallurgy or an Au layer adjacent to the metal carrier is utilized. Additionally, adhesion layers of chromium (Cr) or Cr/Cu may be applied to the carrier 1 for better adhesion of the wiring patterns 3 or to create a more suitable seed metal. After application of the wiring patterns 3, they can be inspected for defects and their heights measured prior to further processing.

Figure 1B:
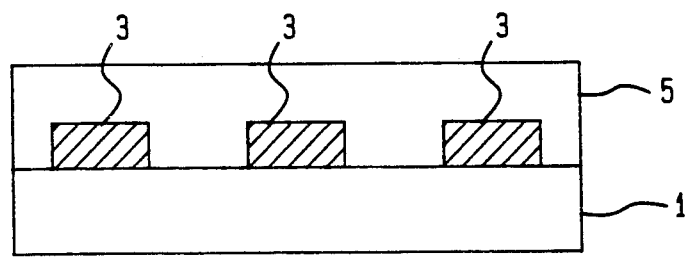

FIG. 1b shows a thermoplastic dielectric 5 or a dielectric with a thermoplastic coating applied over the wiring patterns 3 by lamination or other suitable techniques. The dielectric 5 may be any low glass transition temperature ($T_g$) material that will become adhesive upon the application of temperature and pressure. When the dielectric 5 has a low $T_g$, it is capable of flowing at low temperatures so that the coating flows over the wiring patterns 3 to create a planar surface. Thus, the need for further machining operations is eliminated. Also, when low $T_g$ materials are used, the dielectric 5 is likely to have low stress, which is beneficial in handling and processing high density circuitry. The thermoplastic property of the dielectric 5 allows it to stick to the etchable carrier 1 and remain adhesive upon relamination for attachment of additional layers. Materials which are suitable for use as a coating include thermoplastic materials such as teflon, polyetherimide, polysulfone, silicone modified polyimides and the like. In addition, the thermoplastic materials may be filled with particles of glass-ceramic, carbon or other similar materials to lower the expansion for a better expansion match to the etchable carrier.

Figure 1C:
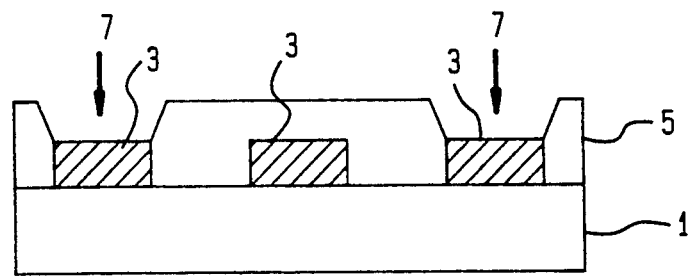
Figure 1D:
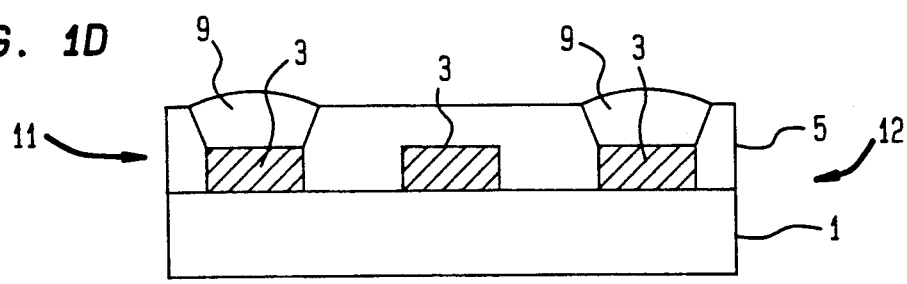
Figure 1E:
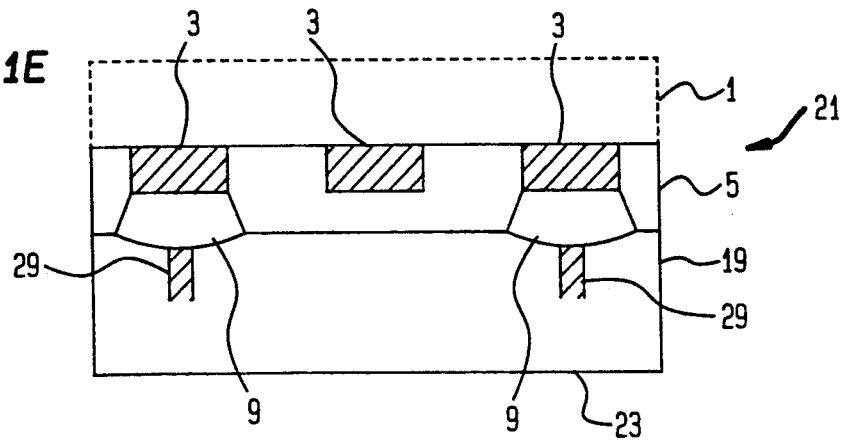

FIG. 1c shows the formation of connecting vias 7 in desired locations using standard techniques such as laser, dry or wet etching. The vias 7 provide passages which allow the wiring patterns 3 to be interconnected to circuitry that will be formed on the top of the final structure. FIG. 1d shows the deposition of a joining material 9 in the connecting vias 7. In a preferred embodiment, the vias 7 are screened with a conductive adhesive to facilitate the subsequent joining to other circuitry layers. Alternatively, the vias 7 may be plated with a typical joining metallurgy such as lead/tin (Pb/Sn), Au/Sn, Au or Al. Individual metal transfer layers 11 are then inspected for defects, repaired and sorted. A subunit 12, comprising a metal transfer layer 11 and carrier 1 is then aligned and laminated to a substrate 19. The lamination process generally involves the application of a pressure of about 30-3000 psi in a temperature range above the $T_g$ of thermoplastic dielectric. In FIG. 1e, layer 11 has been inverted to form a metal layer on top of the substrate. However, layer 11 may also be applied in an upright fashion to side 23 of the substrate 19 to form a metal layer on the bottom of the substrate 19. During lamination, electrical connections are formed between the wiring patterns 3 and the substrate 19 through vias 29. The carrier 1 is then removed by etching or other suitable means.

Figure 2:
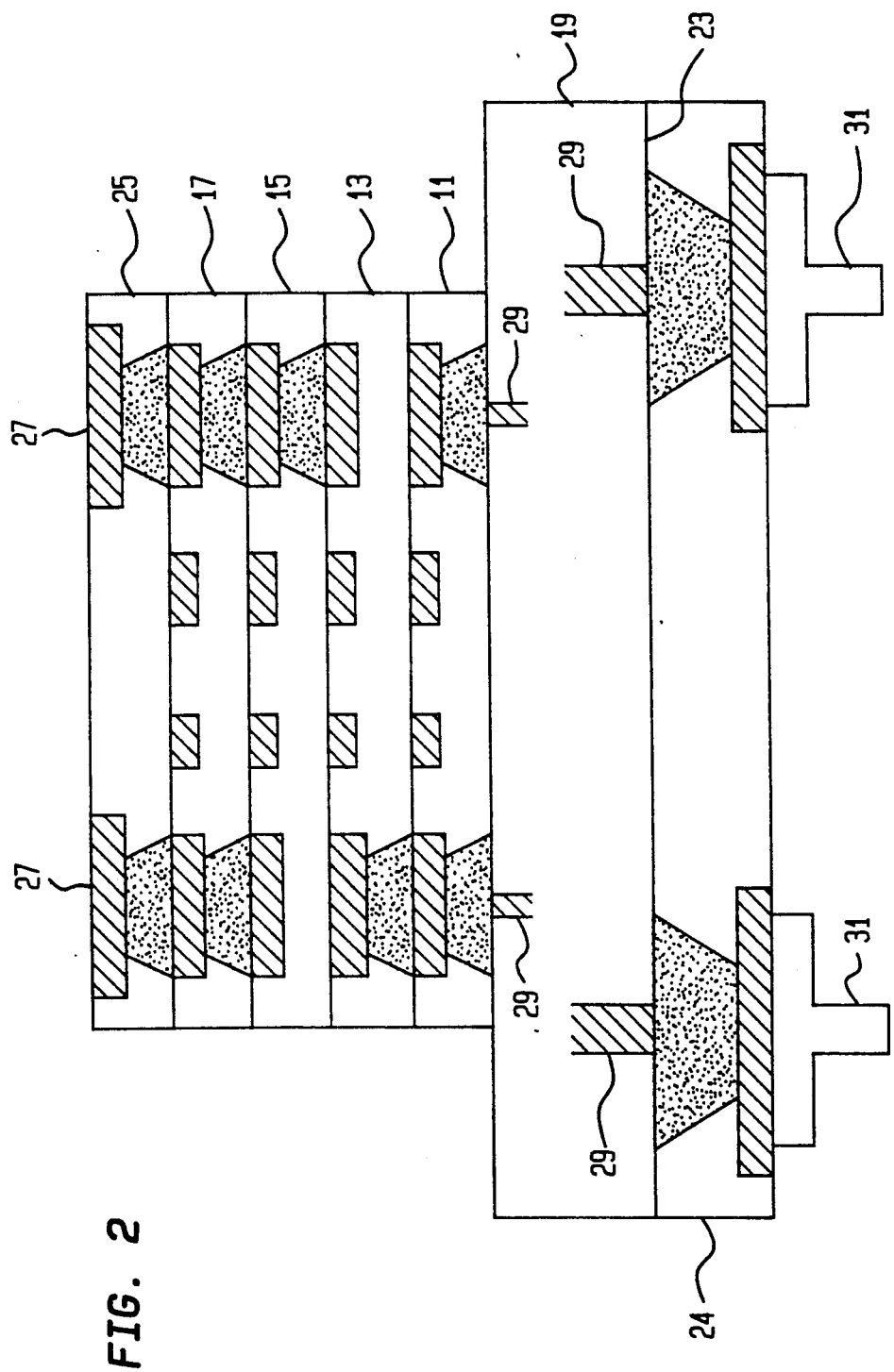
FIG. 2 is a cross-sectional side view of a multilayer structure formed by the metallization transfer process of the present invention.

FIG. 2 shows a multilayer structure fabricated in accordance with the method of the present invention. Layers 13, 15 and 17 are formed in the same manner as layer 11. Each layer is individually inspected and laminated to the structure 21; i.e., layer 11 is first laminated to substrate 19 followed by removal of the carrier 1, then lamination of layer 13 to layer 11, removal of the carrier and so on. By building layers in the parallel fashion thus described, small localized sections of high density wiring can be attached to larger cards or cables in areas in which the density is required.

In a preferred embodiment, a layer 25 with pads 27 only, i.e., no wiring, is fabricated, laminated and etched using the same processes. This top pad level creates solid pads on the top surface for attachment of electronic components such as chips, capacitors, etc. The bottom surface 23 may be similarly laminated with metal transfer layers 24 to support pad on pad or pin connections 31. Generally, the final structure will connect anywhere from 1 to 100 chips.

The parallel fabrication process according to the invention has several benefits. First, fabrication time is reduced because individual metal transfer layers can be created simultaneously, thereby allowing a multilayer thin film structure to be manufactured in the same amount of time as a single layer structure. Second, since individual layers are inspectable, defects can be screened out before joining. Third, since layers are fabricated with an adhesive, they may be attached to more standard packaging components such as flex cables, cards and ceramic substrates to form high density, high performance thin film wiring. Fourth, since both wiring and vias are formed in individual layers which are then joined together, the resulting structure is easily adaptable to high density wiring.

While the invention has been described in terms of several preferred embodiments which can be used singly or in combination, those skilled in the art will recognize that the invention can be practiced with modification within the spirit and scope of the appended claims.

Having thus described our invention, what we claim as new and desire to secure by Letters Patent is as follows:

1. A method for fabricating a multilayer interconnect structure, comprising the steps of:

forming a plurality of subunits comprised of metal carriers and metal transfer layers, each of said metal carriers having a thermal coefficient of expansion matched to a substrate which will be joined to said metal transfer layers, each of said metal transfer layers made by the steps of forming wiring patterns on each of said metal carriers, applying a layer of thermoplastic material over said wiring patterns, forming vias in said thermoplastic material which terminate at said wiring patterns, and depositing a joining material in said vias;

joining a first of said subunits to a substrate with said joining material in said first of said subunits electrically connecting said wiring patterns in said first of said subunits to said substrate;

removing said metal carrier from said first of said subunits;

joining at least a second of said subunits to said first of said subunits, said joining material in said second of said subunits electrically connecting said wiring patterns in said second of said subunits to said first of said subunits; and removing said metal carrier from said second of said subunits.

2. A method as recited in claim 1 wherein said step of applying a layer of thermoplastic material is performed by lamination.

3. A method as recited in claim 1 wherein said joining material is selected to be a screened conductive adhesive.

4. A method as recited in claim 1 wherein said thermoplastic material is selected to be a low glass transition temperature material.

5. A method as recited in claim 1 further comprising the step of inspecting said metal transfer layers.

6. A method as recited in claim 1 further comprising the step of attaching at least one of said metal transfer layers to electronic packaging components.

7. A method as recited in claim 1 further comprising the steps of:
   forming a metal transfer layer having connecting pads; and
   applying said metal transfer layer as a top layer on said multilayer interconnect structure.

8. A method as recited in claim 1 wherein said thermoplastic material is selected from the group consisting of teflon, polyetherimide, polysulfone, and silicone modified polyimide.

9. A method as recited in claim 1 further comprising the step of adding fillers to said thermoplastic material to adjust a thermal expansion of said thermoplastic material.

10. A method as recited in claim 9 wherein said fillers are selected from the group consisting of glass-ceramic and carbon.

* * * * *